United States Patent
Kim et al.

(10) Patent No.: US 8,557,629 B1
(45) Date of Patent: Oct. 15, 2013

(54) SEMICONDUCTOR DEVICE HAVING OVERLAPPED VIA APERTURES

(75) Inventors: Jin Seong Kim, Seoul (KR); Dong Joo Park, Incheon (KR); Kwang Ho Kim, Kyunggi-do (KP); Hee Yeoul Yoo, Seoul (KR); Jeong Wung Jeong, Jeollabuk-do (KR)

(73) Assignee: Amkor Technology, Inc., Chandler, AZ (US)

( * ) Notice: Subject to any disclaimer, the term of this patent is extended or adjusted under 35 U.S.C. 154(b) by 347 days.

(21) Appl. No.: 12/959,911

(22) Filed: Dec. 3, 2010

(51) Int. Cl.
*H01L 21/00* (2006.01)
*H01L 31/0232* (2006.01)
*H01L 23/28* (2006.01)

(52) U.S. Cl.
USPC .......................... 438/106; 257/433; 257/787

(58) Field of Classification Search
USPC ................... 257/433, 787; 438/106
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993.

(Continued)

*Primary Examiner* — James Mitchell
(74) *Attorney, Agent, or Firm* — McKay and Hodgson, LLP; Serge J. Hodgson (57) ABSTRACT

Disclosed is a semiconductor device having overlapped via apertures formed in an encapsulant to outwardly expose solder balls. When different types of semiconductor devices are electrically connected to the solder balls through the overlapped via apertures, flux or solder paste is unlikely to contact sidewall portions of the overlapped via apertures. Therefore, different types of semiconductor devices can be mounted with improved efficiency.

11 Claims, 5 Drawing Sheets

(56) References Cited

U.S. PATENT DOCUMENTS

| | | |
|---|---|---|
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,608,265 A * | 3/1997 | Kitano et al. .................. 257/738 |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,924,003 A | 7/1999 | Slocum |
| 5,936,843 A | 8/1999 | Ohshima et al. |
| 5,952,611 A | 9/1999 | Eng et al. |
| 5,973,393 A * | 10/1999 | Chia et al. ...................... 257/690 |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B2 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 6,987,314 B1 | 1/2006 | Yoshida et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,185,426 B1 | 3/2007 | Hiner et al. |
| 7,198,980 B2 | 4/2007 | Jiang et al. |
| 7,242,081 B1 | 7/2007 | Lee |
| 7,262,082 B1 * | 8/2007 | Lin et al. ........................ 438/109 |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,459,349 B1 | 12/2008 | Yoshida et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,714,453 B2 * | 5/2010 | Khan et al. ..................... 257/787 |
| 7,737,542 B1 | 6/2010 | Yoshida et al. |
| 7,777,351 B1 | 8/2010 | Berry et al. |
| 7,825,520 B1 | 11/2010 | Longo et al. |
| 7,851,894 B1 * | 12/2010 | Scanlan ........................... 257/659 |
| 7,968,918 B2 * | 6/2011 | Kim ................................ 257/276 |
| 8,058,101 B2 * | 11/2011 | Haba et al. ..................... 438/109 |
| 8,076,765 B2 * | 12/2011 | Chen et al. ..................... 257/686 |
| 8,405,212 B2 * | 3/2013 | Chu et al. ....................... 257/738 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0121764 A1 * | 6/2005 | Mallik et al. ................... 257/686 |
| 2005/0139985 A1 | 6/2005 | Takahashi |

(56) References Cited

U.S. PATENT DOCUMENTS

| | | | |
|---|---|---|---|
| 2005/0242425 | A1 | 11/2005 | Leal et al. |
| 2007/0273049 | A1 | 11/2007 | Khan et al. |
| 2007/0281471 | A1 | 12/2007 | Hurwitz et al. |
| 2007/0290376 | A1 | 12/2007 | Zhao et al. |
| 2008/0230887 | A1 | 9/2008 | Sun et al. |
| 2011/0117700 | A1* | 5/2011 | Weng et al. .................... 438/109 |
| 2011/0140247 | A1* | 6/2011 | Pagaila et al. ................. 257/659 |
| 2012/0228782 | A1* | 9/2012 | Kawata et al. ................ 257/777 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Darveaux et al., "Stackable Treated Via Package and Method", U.S. Appl. No. 12/787,238, filed May 25, 2010.

Yoshida et al., "Stackable Semiconductor Package", U.S. Appl. No. 12/799,751, filed Apr. 30, 2010.

Darveaux et al., "Stackable Package and Method", U.S. Appl. No. 12/917,185, filed Nov. 1, 2010.

Yoshida et al., "Stackable Semiconductor Package", U.S. Appl. No. 12/931,325, filed Jan. 27, 2011.

Kim et al., "Semiconductor Device and Fabricating Method Thereof", U.S. Appl. No. 12/943,540, filed Nov. 10, 2010.

* cited by examiner

SEMICONDUCTOR DEVICE HAVING OVERLAPPED VIA APERTURES

TECHNICAL FIELD

The present application relates to a semiconductor device having an overlapped via aperture.

BACKGROUND

In order to integrate a logic device including a baseband, application, an image processor, and the like, and a high performance memory of a mobile product such as a smart phone handset or a digital camera, a package-on-package (PoP) has come into the spotlight. One exemplary PoP is generally constructed such that a logic device is implemented on a printed circuit board by wire bonding or flip chip bonding and a memory device is electrically connected to the logic device by solder balls.

Recently, considerations for POP are an increased number of pins and higher electrical performance. Moreover, future trends required for POP include increased interconnect density, a reduced pitch, reduced package size and thickness, improved warpage controllability, a reduction in the tooling cost, a variety of interconnect architectures, and so on.

BRIEF DESCRIPTION OF THE DRAWINGS

Common reference numerals are used throughout the drawings and the detailed description to indicate the same or similar elements.

DETAILED DESCRIPTION

Figure 5:
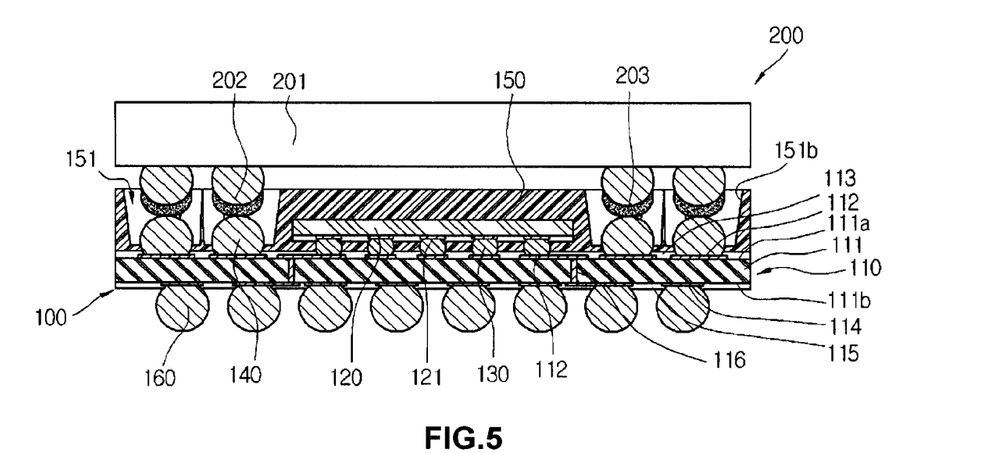
FIG. 5 is a cross-sectional view illustrating a state in which the semiconductor device of FIG. 1A is connected to another semiconductor device according to another embodiment.

As an overview and in accordance with one embodiment, referring to FIGS. 1A, 1B, 2A, 2B, a semiconductor device 100 includes overlapped via apertures 151 formed in an encapsulant 150 to outwardly expose solder balls 140. Referring now to FIG. 5, when different types of semiconductor devices 201 are electrically connected to the solder balls 140 through the overlapped via apertures 151, flux or solder paste 203 is unlikely to contact sidewall portions 151b of the overlapped via apertures 151. Therefore, different types of semiconductor devices 201 can be mounted with improved efficiency.

Figure 1A:
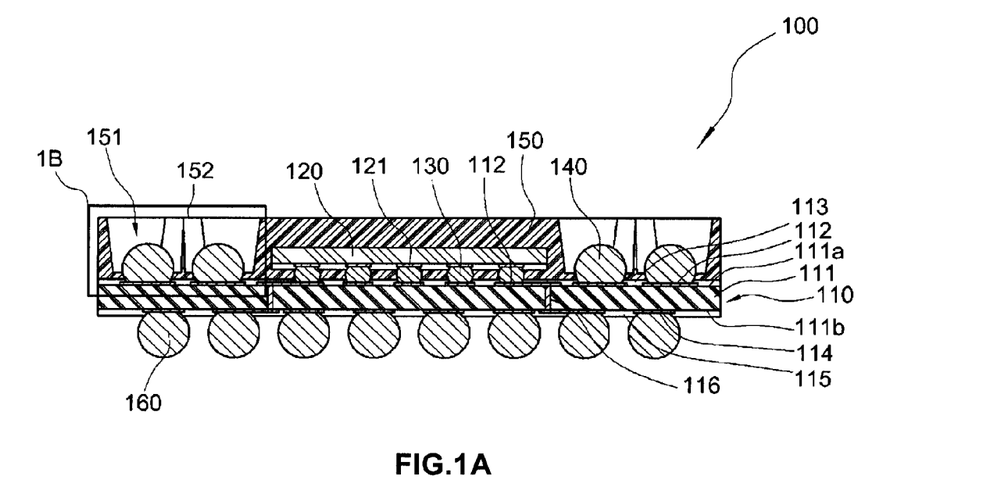
FIG. 1A is a cross-sectional view of a semiconductor device according to an embodiment.
Figure 1B:
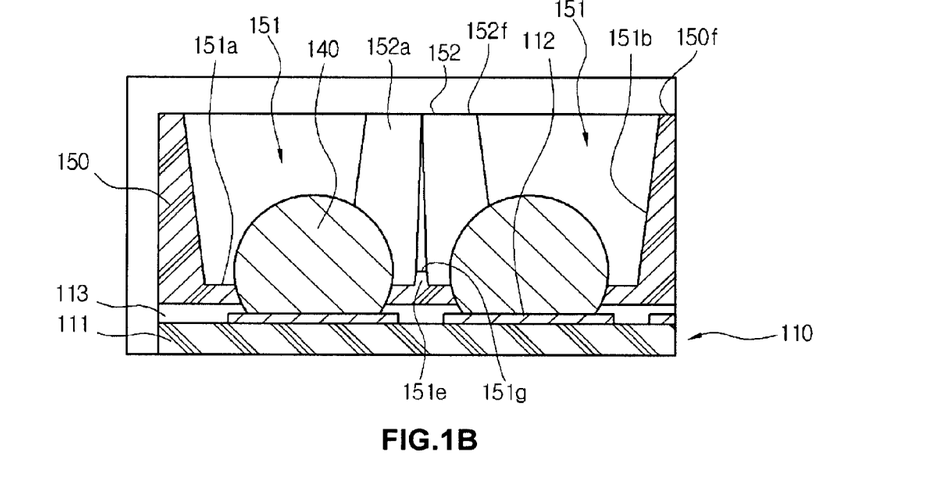
FIG. 1B is an enlarged cross-sectional view of a portion 1B of the semiconductor device of FIG. 1A.

Now in more detail, FIG. 1A is a cross-sectional view of a semiconductor device 100 according to an embodiment. FIG. 1B is an enlarged cross-sectional view of a portion 1B of the semiconductor device 100 of FIG. 1A.

As illustrated in FIGS. 1A and 1B, the semiconductor device 100, sometimes called an assembly, includes a printed circuit board 110, a semiconductor die 120, a plurality of conductive bumps 130, a plurality of first solder balls 140, an encapsulant 150, and a plurality of second solder balls 160.

The printed circuit board 110, sometimes called a substrate, includes an insulation layer 111, a first circuit pattern 112, a first solder mask 113, a second circuit pattern 114, a second solder mask 115, and conductive vias 116. The insulation layer 111 has a substantially planar first surface 111a, and a substantially planar second surface 111b opposite to the first surface 111a. In addition, the insulation layer 111 may be made of a rigid or flexible material, but is not limited thereto.

The first circuit pattern 112 is formed on the first surface 111a of the insulation layer 111, and may be generally formed of a copper pattern. The first solder mask 113 covers the first circuit pattern 112 and the first surface 111a around the first circuit pattern 112. However, the first solder mask 113 is not formed on a predetermined area, e.g., on bond fingers and/or terminals, of the first circuit pattern 112 requiring an electrical connection. For example, the first solder mask 113 is not formed at an area of the first circuit pattern 112, where the conductive bumps 130 and the first solder balls 140 are connected to the first circuit pattern 112, which will later be described.

The second circuit pattern 114 is formed on the second surface 111b of the insulation layer 111, and is generally formed of a copper pattern. The second solder mask 115 covers the second circuit pattern 114 and the second surface 111b around the second circuit pattern 114. However, the second solder mask 115 is not formed at a predetermined area, e.g., terminals, of the second circuit pattern 114 requiring an electrical connection. For example, the second solder mask 115 is not formed at an area, e.g., terminals, of the second circuit pattern 114 connected to the second solder balls 160, which will later be described.

The semiconductor die 120 is positioned on the printed circuit board 110. In addition, the semiconductor die 120 includes a plurality of bond pads 121 that face toward the printed circuit board 110. The semiconductor die 120 may be a general memory semiconductor, a logic semiconductor, or the like, but is not limited thereto. A width of the semiconductor die 120 is generally smaller than the width of the printed circuit board 110.

The conductive bumps 130 are formed between the printed circuit board 110 and the semiconductor die 120 to electrically connect the printed circuit board 110 and the semiconductor die 120 to each other. That is to say, the conductive bumps 130 electrically connect the bond pad 121 of the semiconductor die 120 to the first circuit pattern 112, e.g., bond fingers thereof, of the printed circuit board 110. The conductive bumps 130 may be made of any one selected from gold (Au), silver (Ag), solder, and equivalents thereof, but are not limited thereto.

The first solder balls 140 are electrically connected to the first circuit pattern 112, e.g., terminals thereof, of the printed circuit board 110. That is to say, the first solder balls 140 are electrically connected to the first circuit pattern 112 formed at the outer periphery of the semiconductor die 120. In addition, the first solder balls 140 may be made of any one selected from tin-lead (Sn—Pb), tin-lead-silver (Sn—Pb—Ag), tin-lead-bismuth (Sn—Pb—Bi), tin-copper (Sn—Cu), tin-silver (Sn—Ag), tin-bismuth (Sn—Bi), tin-silver-copper (Sn—Ag—Cu), tin-silver-bismuth (Sn—Ag—Bi), tin-zinc (Sn—Zn), and equivalents thereof, but are not limited thereto.

The encapsulant 150 covers the semiconductor die 120 mounted on the printed circuit board 110 and the conductive bumps 130, thereby, protecting the same from the outside environments. The encapsulant 150 also covers lower regions of the first solder balls 140.

Meanwhile, overlapped via apertures 151 are formed in the encapsulant 150 to allow the plurality of first solder balls 140 to be exposed outwardly together. In an exemplary embodiment, the overlapped via apertures 151 formed in the encapsulant 150 expose the plurality of first solder balls 140 upwardly together.

In more detail, the overlapped via aperture 151 is defined by a bottom portion 151a of the encapsulant 150. Accordingly, the overlapped via aperture 151 is sometimes said to have a bottom portion 151a. The bottom portion 151a covers the first solder ball 140 and is generally shaped as an annulus.

The overlapped via aperture 151 is further defined by a sidewall portion 151b of the encapsulant 150. Accordingly, the overlapped via aperture 151 is sometimes said to have a sidewall portion 151b. The sidewall portion 151b is separated from the plurality of first solder balls 140 and upwardly extends from the bottom portion 151a to a top portion 150f of the encapsulant 150. A first protrusion 151e of the encapsulant 150 is formed substantially in the middle of (between) adjacent bottom portions 151a and protrudes upwards from the bottom portions 151a.

The bottom portions 151a are formed to be substantially planar and cover lower portions of the first solder balls 140, as described above. In addition, the sidewall portions 151b are formed at an angle in a range of approximately 70° to approximately 90° with respect to the bottom portions 151a and are spaced a predetermined distance apart from the first solder balls 140. In addition, the first protrusion 151e is formed at the center between each of the bottom portion 151a and/or the center between each of the plurality of first solder balls 140.

A thickness of the first protrusion 151e is smaller than that of the encapsulant 150. In practice, the thickness of the first protrusion 151e may be smaller than a diameter of the first solder balls 140. In one embodiment, the height of a top end 151g of the first protrusion 151e above the printed circuit board 110 may be lower than the height of the center of the first solder balls 140 above the printed circuit board 110.

However, in other embodiments, the height of the top end 151g of the first protrusion 151e above the printed circuit board 110 may be lower than, equal to, or greater than, the height of the first solder balls 140 above the printed circuit board 110. Generally, the greater the overlap between overlapped via aperture 151, the lower the height of top end 151g of the first protrusion 151e above the printed circuit board 110.

A width of the overlapped via aperture 151 is greater than a pitch between the first solder balls 140. The pitch is the center to center spacing between adjacent first solder balls 140. The width of the overlapped via apertures 151 is greater than the pitch of the first solder balls 140 such the overlapped via apertures 151 overlap each other. A second protrusion 152 is formed inward of the first protrusions 151e, which will further be described below.

The second solder balls 160 are electrically connected to the second circuit pattern 114 of the printed circuit board 110. The second solder balls 160 are to be later mounted on an external device (not shown) such as a larger circuit board. Therefore, the second solder balls 160 practically electrically connect the semiconductor device 100 to the external device while mechanically fixing the semiconductor device 100 to the external device.

Figure 2A:
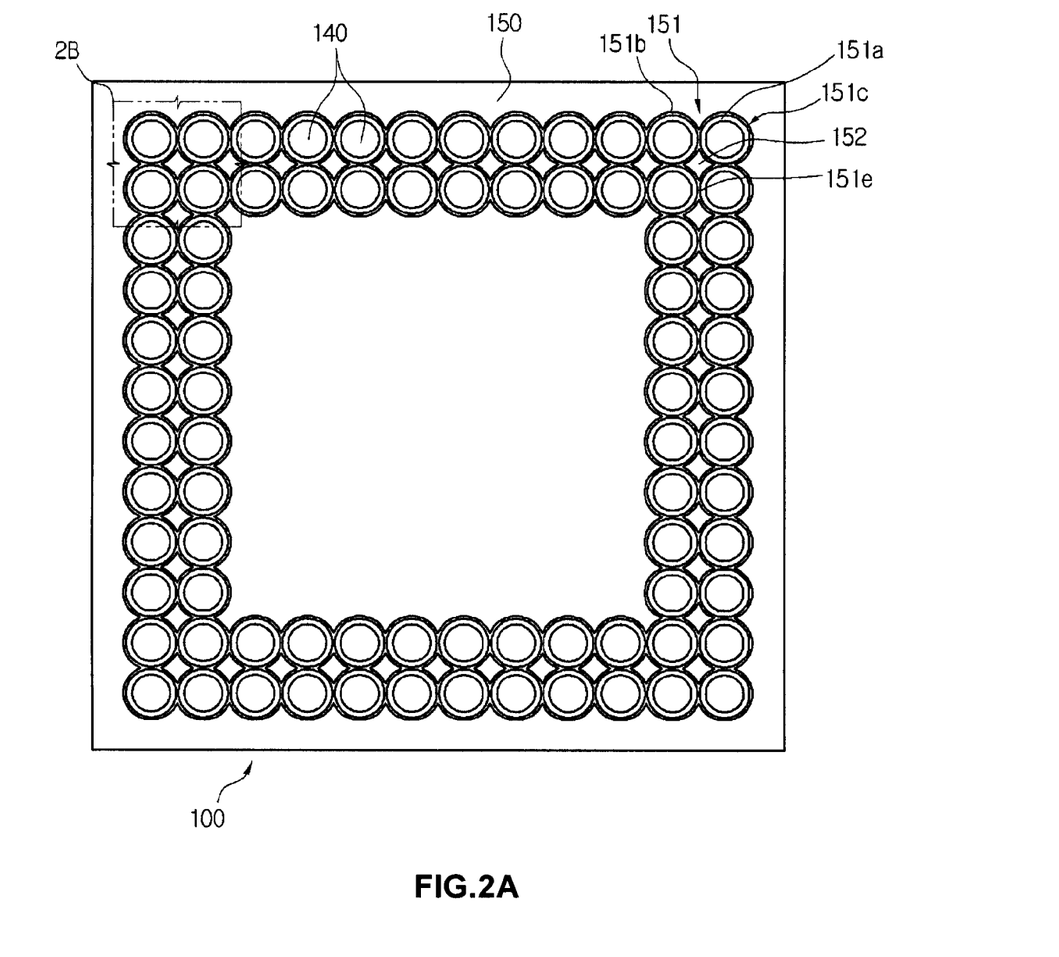
FIG. 2A is a top plan view of the semiconductor device of FIG. 1A according to an embodiment.
Figure 2B:
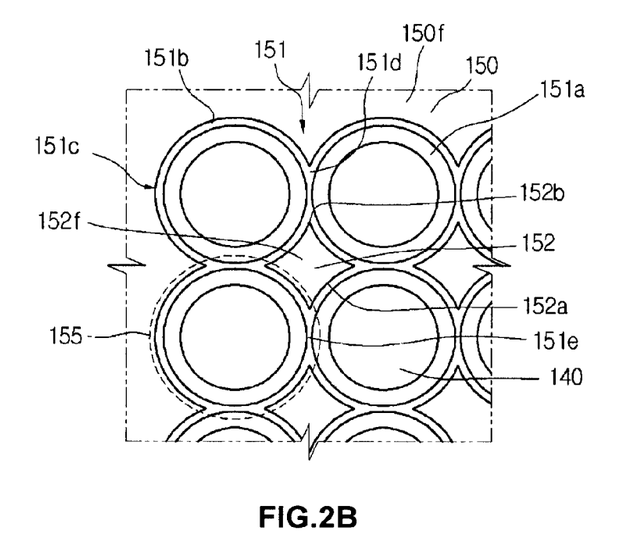
FIG. 2B is an enlarged top plan view of a portion 2B of the semiconductor package of FIG. 2A.

FIG. 2A is a top plan view of the semiconductor device 100 of FIG. 1A according to an embodiment. FIG. 2B is an enlarged top plan view of a portion 2B of the semiconductor device 100 of FIG. 2A. As illustrated in FIGS. 2A and 2B, a plurality of overlapped via apertures 151 collectively shaped as a substantially square dual-stacked line are formed in the encapsulant 150. In addition, a plurality of first solder balls 140 are outwardly exposed together through the overlapped via apertures 151. In the illustrated embodiment, the overlapped via apertures 151 collectively have a substantially square, two lined shape.

In alternative embodiments, however, overlapped via apertures 151 collectively have a substantially square shape of two or more lines, or have several disconnected overlapped via apertures. That is to say, the shapes of the overlapped via apertures 151 are not limited to that illustrated in the exemplary embodiment.

The overlapped via apertures 151 outwardly exposing the plurality of first solder balls 140 together according to the illustrated embodiment will now be described in detail. Generally, each overlapped via aperture 151 is defined by an imaginary circle 155 in the plane of top portion 150f of encapsulant 150. The imaginary circles 155 of adjacent overlapped via apertures 151 overlap each other such that the sidewall portions 151b and sides 152a, which lie upon the imaginary circle 155, of the overlapped via apertures 151 are separated from one another.

Where two imaginary circles 155 overlap each other, the first protrusion 151e is formed. At a central area defined by four imaginary circles 155, the second protrusion 152 is formed. The second protrusion 152 is a portion of the encapsulant 150 that was not removed during formation of overlapped via apertures 151, but is surrounded by the overlapped via apertures 151.

The overlapped via apertures 151 have the sidewall portions 151b each having a substantially arc-shaped curve 151c partially corresponding to the circumference of each of the first solder balls 140. The arc-shaped curve 151c is a portion of the imaginary circle 155.

The arc-shaped curves 151c and imaginary circles 155 overlap each other, forming overlapped areas 151d. Each of the first solder balls 140 is positioned within the arc-shaped curve 151c and imaginary circle 155. In addition, a predetermined area of the bottom portion 151a, extending from the first solder balls 140 to the sidewall portion 151b, is exposed.

The first protrusion 151e is formed at the overlapped area 151d between one of the first solder balls 140 and the other adjacent to the one of the first solder balls 140, i.e., between adjacent solder balls 140. That is to say, the first protrusion 151e having a height smaller than the encapsulant 150 is formed in each of the overlapped areas 151d.

A second protrusion 152, sometimes called a central protrusion 152, having a predetermined thickness is formed at the center of an area formed by, for example, four of the first solder balls 140. The thickness of the second protrusion 152 is the same as that of the encapsulant 150, i.e., a top end 152f of the second protrusion 152 is parallel to and coplanar with the top portion 150f of the encapsulant 150.

The second protrusion 152 may be shaped of a diamond or rhombus having a plurality of sides 152a. In addition, centers of the respective sides 152a of the second protrusion 152 are recessed or bent, i.e., curved, toward of the center of the second protrusion 152. The center of the respective sides 152a of the second protrusion 152 face the center of the first solder balls 140 corresponding thereto. In addition, the second protrusion 152 has four vertices 152b, which face between the center of two, for example, of the first solder balls 140. Further, each of the vertices 152b of the second protrusion 152 faces the overlapped area 151d of the arc-shaped curve 151c and the first protrusion 151e formed in the overlapped area 151d.

Figure 3:
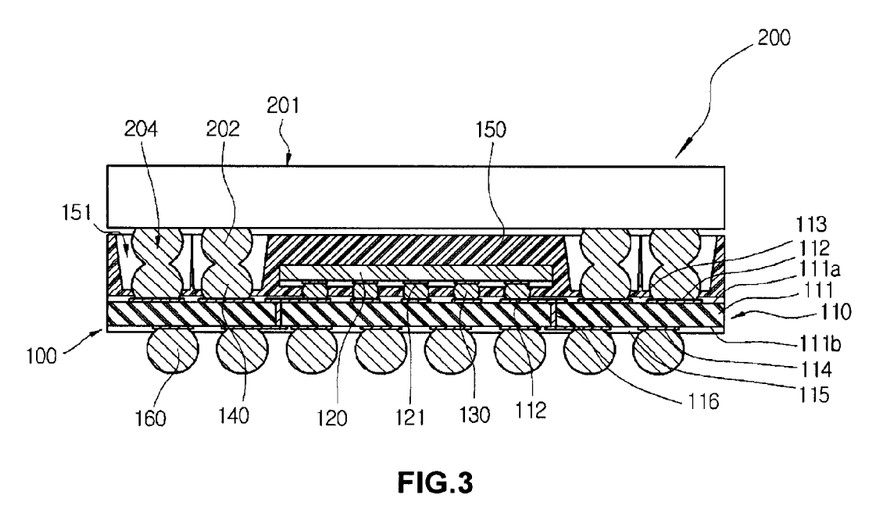
FIG. 3 is a cross-sectional view of a package-on-package using the semiconductor device according to an embodiment.

FIG. 3 is a cross-sectional view of a package-on-package 200 using the semiconductor device 100 according to an embodiment. As illustrated in FIG. 3, a semiconductor device 201 is mounted on the semiconductor device 100, thereby achieving the package-on-package 200, sometimes called an assembly. Here, the semiconductor device 201 different from the semiconductor device 100 may be a memory semiconductor, a logic semiconductor, and equivalents thereof, but is not limited thereto. In an exemplary embodiment, if the semiconductor device 100 is a memory semiconductor, the semiconductor device 201 may be a logic semiconductor.

The semiconductor device 201 according to the illustrated embodiment may also include solder balls 202, which are electrically connected to first solder balls 140 through the exposed overlapped via apertures 151. In practice, the solder balls 202 and the first solder balls 140 of different types of the semiconductor devices 100 and 201 are reflown, followed by cooling, thereby being electrically connected to each other as integral solder columns 204.

Figure 4A:
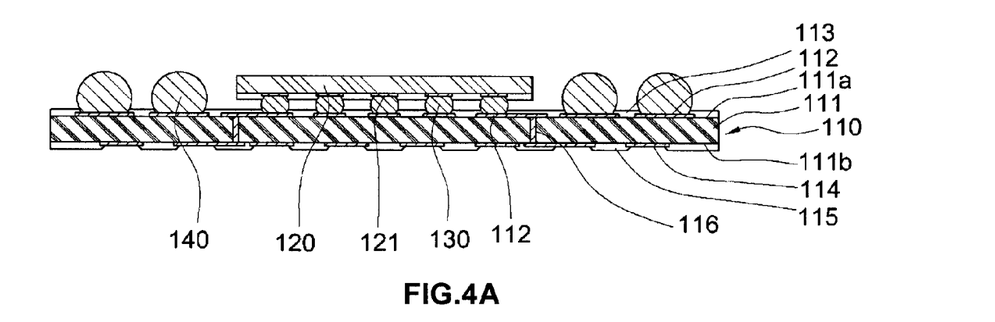
FIGS. 4A, 4B, 4C, 4D are cross-sectional views illustrating a method of manufacturing a semiconductor device according to another embodiment.

FIGS. 4A, 4B, 4C, 4D are cross-sectional views illustrating a method of manufacturing a semiconductor device according to another embodiment. As illustrated in FIG. 4A, the semiconductor die 120 is attached to the printed circuit board 110 using the conductive bumps 130. In addition, a plurality of first solder balls 140 are also attached to the printed circuit board 110.

The semiconductor die 120 having the conductive bumps 130 attached thereto is placed on the printed circuit board 110, e.g., to bond fingers of the first circuit pattern 112, to then perform a general reflow process to attach the semiconductor die 120 to the printed circuit board 110. In addition, the first solder balls 140 are placed on the printed circuit board 110, e.g., on terminals of the first circuit pattern 112, using flux to then perform a general reflow process to attach the first solder balls 140 to the printed circuit board 110.

Here, a die attaching process may first be performed and a solder ball attaching process may then be performed, and vice versa. Alternatively, the die attaching process and the solder ball attaching process may be performed at the same time.

Figure 4B:
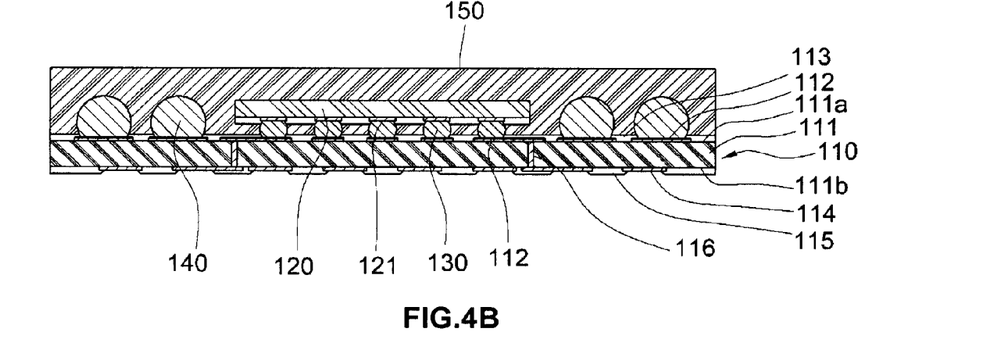

As illustrated in FIG. 4B, the semiconductor die 120, the conductive bumps 130 and the first solder balls 140 are encapsulated using the encapsulant 150. In an exemplary embodiment, the semiconductor device shown in FIG. 4A is positioned inside a mold and the encapsulant 150 in a liquid phase is injected into the mold. Subsequently, if the encapsulant 150 injected into the mold is cured, the encapsulated semiconductor device 100 is taken out from the mold. After the encapsulation, a curing process may further be performed.

Figure 4C:
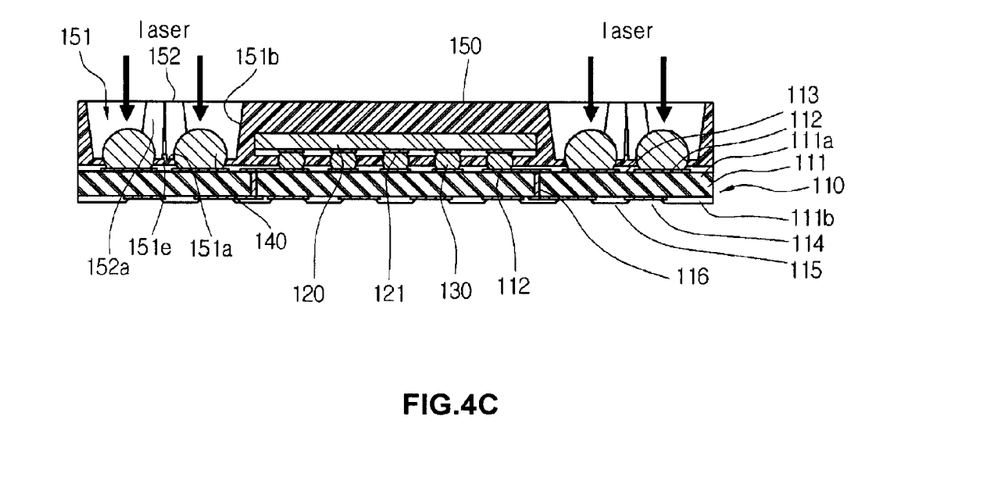

As illustrated in FIG. 4C, a predetermined area of the encapsulant 150 corresponding to the plurality of first solder balls 140 is removed by a laser beam, e.g., using laser-ablation, thereby forming the overlapped via apertures 151. Here, the laser beam is supplied to a predetermined area of the encapsulant 150 corresponding to one first solder ball 140.

Additionally, a width or area of the encapsulant 150 removed by the laser beam is greater than that of the one first solder ball 140. Therefore, if the laser beam is supplied to four first solder balls 140, like in an exemplary embodiment, the planar overlapped via apertures 151 according to the illustrated embodiment may have a first protrusion 151e having a thickness smaller than that of the encapsulant 150, and a second protrusion 152 having a thickness equal to that of the encapsulant 150.

The first protrusion 151e is formed at a boundary area between one of the four first solder balls 140 (and a first overlapped via aperture 151) and the other adjacent to the one first solder ball 140 (and an adjacent second overlapped via aperture 151). The second protrusion 152 is formed at a central area formed by, for example, four first solder balls 140 (and four adjacent overlapped via apertures 151).

Here, the overlapped via apertures 151 formed by the laser beam includes a substantially planar bottom portion 151a formed around the solder balls 140, a sidewall portion 151b separated from the solder balls 140, and a side 152a also separated from the solder balls 140. In addition, the laser beam makes the bottom portion 151a remain on the printed circuit board 110 to a predetermined thickness, thereby allowing the first solder balls 140 to be tightly interlocked with the bottom portion 151a.

Figure 4D:
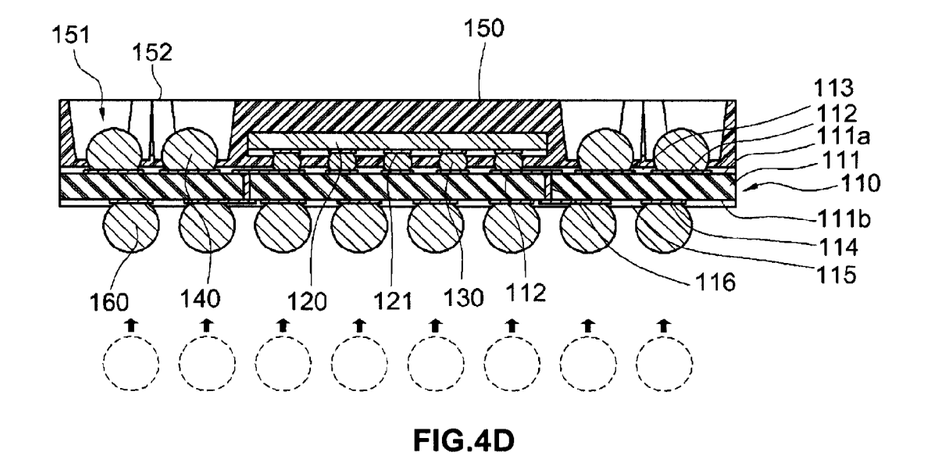

As illustrated in FIG. 4D, a plurality of second solder balls 160 are attached to the printed circuit board 110, e.g., to terminals of the second circuit pattern 114. In an exemplary embodiment, the second solder balls 160 are placed on the printed circuit board 110 using flux to then perform a general reflow process to attach the second solder balls 160 to the printed circuit board 110. In practice, since the semiconductor device shown in FIG. 4D is processed upside down, the printed circuit board 110 and the second solder balls 160 are not separated from each other due to a gravitational action.

FIG. 5 is a cross-sectional view illustrating a state in which the semiconductor device 100 of FIG. 1A is connected to another semiconductor device 201 according to another embodiment to form the package-on-package 200. As illustrated in FIG. 5, the semiconductor device 201 may be electrically connected to the semiconductor device 100 according to one embodiment. Here, commonly used flux 203 or solder paste may be used as a connection medium.

In the illustrated embodiment, an overlapped via aperture 151 having a relatively large width or area is formed on the semiconductor device 100. Thus, when solder balls 202 of another semiconductor device 201 are temporarily attached onto the semiconductor device 100 using, for example, flux 203, the flux 203 is unlikely to touch sidewall portions 151b of the overlapped via apertures 151.

Therefore, during a reflow process, the first solder balls 140 formed in the semiconductor device 100 and the solder balls 202 formed in another semiconductor device 201 are uniformly melted and cooled, so that the semiconductor device 201 is not tilted. Since the overlying semiconductor device 201 is not tilted, a good package-on-package 200 can be obtained.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An assembly comprising:
   a substrate comprising a first surface;
   a semiconductor die coupled to the first surface of the substrate;
   an encapsulant covering the first surface of the substrate and the semiconductor die;
   first solder balls coupled to the first surface of the substrate;
   overlapped via apertures formed in the encapsulant and exposing the first solder balls, wherein a width of the overlapped via apertures is greater than a pitch of the first solder balls such that the overlapped via apertures overlap each other; and a first protrusion having a vertical thickness smaller than that of the encapsulant formed between a bottom portion of a first overlapped via aperture and a bottom portion of a second overlapped via aperture, the first protrusion being a portion of the encapsulant.

2. The assembly of claim 1, wherein the overlapped via apertures comprise bottom portions, the bottom portions covering the first solder balls.

3. The assembly of claim 2, wherein the overlapped via apertures further comprise sidewall portions separated from the first solder balls.

4. The assembly of claim 3 wherein the sidewall portions extend upwardly from the bottom portions to a top portion of the encapsulant.

5. The assembly of claim 1 wherein the first protrusion is formed between one of the first solder balls and an adjacent one of the first solder balls.

6. The assembly of claim 1, wherein the height of the first protrusion is less than a height of the first solder balls.

7. The assembly of claim 1, wherein the height of the first protrusion is equal to a height of the first solder balls.

8. The assembly of claim 1, wherein the height of the first protrusion is greater than a height of the first solder balls.

9. The assembly of claim 1 further comprising a second semiconductor device coupled to the first solder balls through the overlapped via apertures.

10. A method of forming an assembly comprising:
coupling a semiconductor die to a substrate;
coupling first solder balls to the substrate;
encapsulating the semiconductor die and the first solder balls in an encapsulant;
forming overlapped via apertures in the encapsulant to expose the first solder balls such that the overlapped via apertures overlap each other comprising:
forming a first protrusion having a vertical thickness smaller than a vertical thickness of the encapsulant, the first protrusion being between a bottom portion of a first overlapped via aperture of the overlapped via apertures and a bottom portion of a second overlapped via aperture of the overlapped via apertures, the first protrusion being a portion of the encapsulant.

11. The method of claim 10 wherein the forming overlapped via apertures further comprises:
forming a second protrusion having a vertical thickness equal to a vertical thickness of the encapsulant at a central area formed by the overlapped via apertures.

* * * * *